(12) United States Patent
Lindsay et al.

(10) Patent No.: US 9,046,559 B2
(45) Date of Patent: Jun. 2, 2015

(54) ISOLATION MONITOR

(75) Inventors: Ryan Lindsay, Brentwood, CA (US);
Roger White, Livermore, CA (US);
Scott Bowman, Fairfax, CA (US); John Cochoy, Brentwood, CA (US)

(73) Assignee: CURTIS INSTRUMENTS, INC., Livermore, CA (US)

( * ) Notice: Subject to any disclaimer, the term of this patent is extended or adjusted under 35 U.S.C. 154(b) by 310 days.

(21) Appl. No.: 13/467,834

(22) Filed: May 9, 2012

(65) Prior Publication Data

US 2013/0300430 A1 Nov. 14, 2013

(51) Int. Cl.
*G01R 31/08* (2006.01)
*G01R 31/02* (2006.01)
*B60L 3/00* (2006.01)
*B60L 3/04* (2006.01)
*B60L 11/18* (2006.01)
*G01R 27/18* (2006.01)
*G01R 31/00* (2006.01)

(52) U.S. Cl.
CPC ............ *G01R 31/025* (2013.01); *G01R 31/088* (2013.01); *G01R 31/08* (2013.01); *G01R 31/085* (2013.01); *G01R 27/18* (2013.01); *G01R 31/006* (2013.01); *B60L 3/0046* (2013.01); *B60L 3/0061* (2013.01); *B60L 3/0069* (2013.01); *B60L 3/04* (2013.01); *B60L 11/1803* (2013.01); *B60L 11/1864* (2013.01); *B60L 11/1868* (2013.01); *B60L 2240/547* (2013.01); *B60L 2240/80* (2013.01); *B60L 2250/10* (2013.01); *B60L 2260/50* (2013.01); *Y02T 10/7005* (2013.01); *Y02T 10/7066* (2013.01); *Y02T 10/7061* (2013.01)

(58) Field of Classification Search
CPC .... G01R 31/025; G01R 31/08; G01R 31/088; G01R 31/085
USPC ........................ 324/522; 361/56, 57, 65, 91.1
See application file for complete search history.

(56) References Cited

U.S. PATENT DOCUMENTS

| | | | | |
|---|---|---|---|---|
| 4,110,684 A * | 8/1978 | Gale | ............................. | 324/522 |
| 4,214,311 A * | 7/1980 | Nakashima et al. | ............ | 702/65 |
| 5,101,160 A | 3/1992 | Barjonnet et al. | | |
| 5,272,440 A * | 12/1993 | Weynachter et al. | ......... | 324/522 |
| 5,303,164 A | 4/1994 | Masson et al. | | |
| 5,446,682 A * | 8/1995 | Janke et al. | ..................... | 702/85 |
| 5,469,351 A * | 11/1995 | Masrur et al. | .............. | 363/56.02 |
| 6,794,879 B2 * | 9/2004 | Lawson et al. | ................ | 324/509 |
| 6,930,610 B2 * | 8/2005 | Gao et al. | ...................... | 340/635 |
| 7,649,360 B2 * | 1/2010 | Ivan et al. | ..................... | 324/503 |

(Continued)

OTHER PUBLICATIONS

Hofheinz, Wolfgang "Electrical Safety—Ungrounded Power Supply System in Medical Sites," Business Briefing: Hospital Engineering & Facilities Management, 2003.

(Continued)

*Primary Examiner* — Jermele M Hollington
*Assistant Examiner* — Christopher McAndrew
(74) *Attorney, Agent, or Firm* — Beyer Law Group LLP (57) ABSTRACT

An isolation monitor is disclosed in which a switchable bias voltage is imposed on a chassis ground. An isolation voltage is measured when a bias voltage is applied. When there are no electrical faults, the isolation voltage swings up and down to known values. When a fault occurs, the isolation voltage will not to swing to the known values, and thus the isolation resistance can be measured and alarm generated if the isolation resistance falls below a threshold value.

18 Claims, 9 Drawing Sheets

(56) References Cited

U.S. PATENT DOCUMENTS

| | | | |
|---|---|---|---|
| 8,040,139 B2* | 10/2011 | Plagens et al. | 324/509 |
| 2003/0230443 A1* | 12/2003 | Cramer et al. | 180/65.5 |
| 2004/0169518 A1* | 9/2004 | Saha et al. | 324/522 |
| 2010/0237872 A1* | 9/2010 | Kang et al. | 324/429 |
| 2010/0259276 A1* | 10/2010 | Streit | 324/525 |
| 2011/0199223 A1* | 8/2011 | Akimov et al. | 340/636.1 |
| 2011/0304339 A1* | 12/2011 | Schumacher et al. | 324/509 |

OTHER PUBLICATIONS

PG LifeLink Products, Product Line: Isolated Power Panels, Model IDP, www.Pglifelink.com/model-idp-engisolated.htm, May 25, 2011.

* cited by examiner

ISOLATION MONITOR

FIELD OF THE INVENTION

The present invention is generally directed to electrical isolation monitoring. In particular, the present invention is directed to monitoring electrical isolation between a high voltage electrical system and a chassis frame. An exemplary application is for monitoring electrical isolation in an electric vehicle.

BACKGROUND OF THE INVENTION

An electric vehicle may include a vehicle chassis frame, a battery pack, and an electric motor. In some electric vehicles the total battery voltage for driving the vehicle is fairly high, e.g., 100-200 V or more. The high voltage circuits need to be isolated from the vehicle chassis frame for a variety of safety reasons, including protecting human health of users and technicians.

There are various international safety standards for electric vehicles. Among these international safety standards are European safety standards for electrified vehicles that require that the high voltage circuits are isolated from the chassis frame. An on-board system is required in some of the safety standards in order to detect frame faults. A frame fault is a fault in which the electrical isolation between the high voltage electrical system and the frame decreases below a threshold value. In the case of an electrically powered vehicle, examples of frame faults include the development of leakage paths from the battery pack, degradation of wires in an electric motor, or other faults in the high voltage electrical system.

The safety standards for electric vehicles reduce the risk of technicians or operators from being shocked. In particular, the safety standards provide protection for the situation that a user, who is grounded to the chassis, touches a high voltage terminal or an ungrounded part of the electrical system when there is an insulation failure. As long as the resistance between the chassis and the high voltage system is large enough (i.e., above a threshold level depending on the maximum voltage and other factors), the current that results when a person touches a high voltage element will be limited to a safe level, i.e., a level not hazardous to human health.

There are several known techniques to determine isolation resistance in an electric vehicle, but each of these has significant drawbacks. One way to determine isolation resistance is to measure the current into and out of the power source (e.g., at the battery leads), but an isolation monitor based on this approach that would be precise enough to meet safety standards would be prohibitively expensive for many applications. Another way to determine isolation resistance is to use a fixed impedance circuit to monitor frame voltage or frame leakage current. For example, a simple voltage divider to the chassis with equal value resistor could be used to detect short circuits to the positive or negative battery terminal. However, the inventors of the present application have recognized that this approach does not detect certain types of faults. In particular, the inventors have recognized that in an electric vehicle the battery packs have numerous batteries arranged in a series configuration such that some types of faults can occur at the effective "mid-point" of the battery pack or to a star connection of an induction motor, because the effect of the fault is symmetric. For example, a fault at the precise mid-point of a battery pack has a symmetric effect on voltages such that this type of midpoint fault is undetectable using a simple voltage divider.

Thus, while there are techniques in the prior art to measure isolation resistance, these techniques are generally prohibitively expensive for many applications and generally also have problems in detecting certain types of faults, such as mid-point faults.

Therefore what is desired is an improved apparatus, system, method, and computer program product to monitor electrical isolation.

SUMMARY OF THE INVENTION

An isolation monitor imposes a switchable bias to a chassis through a set of high impedance resistors. In one implementation, switches are used to impose a changing voltage to the chassis through an upper and lower set of high impedance resistors. As a result, when there is no fault the measured isolation voltage swings up to known values. However, when there is a fault the chassis voltage does not swing to the known values. In addition to measuring isolation resistance the isolation monitor may also be configured to determine an approximate location of a fault, such as identifying a mid-point fault in a battery pack or induction motor.

DETAILED DESCRIPTION

Figure 1A:
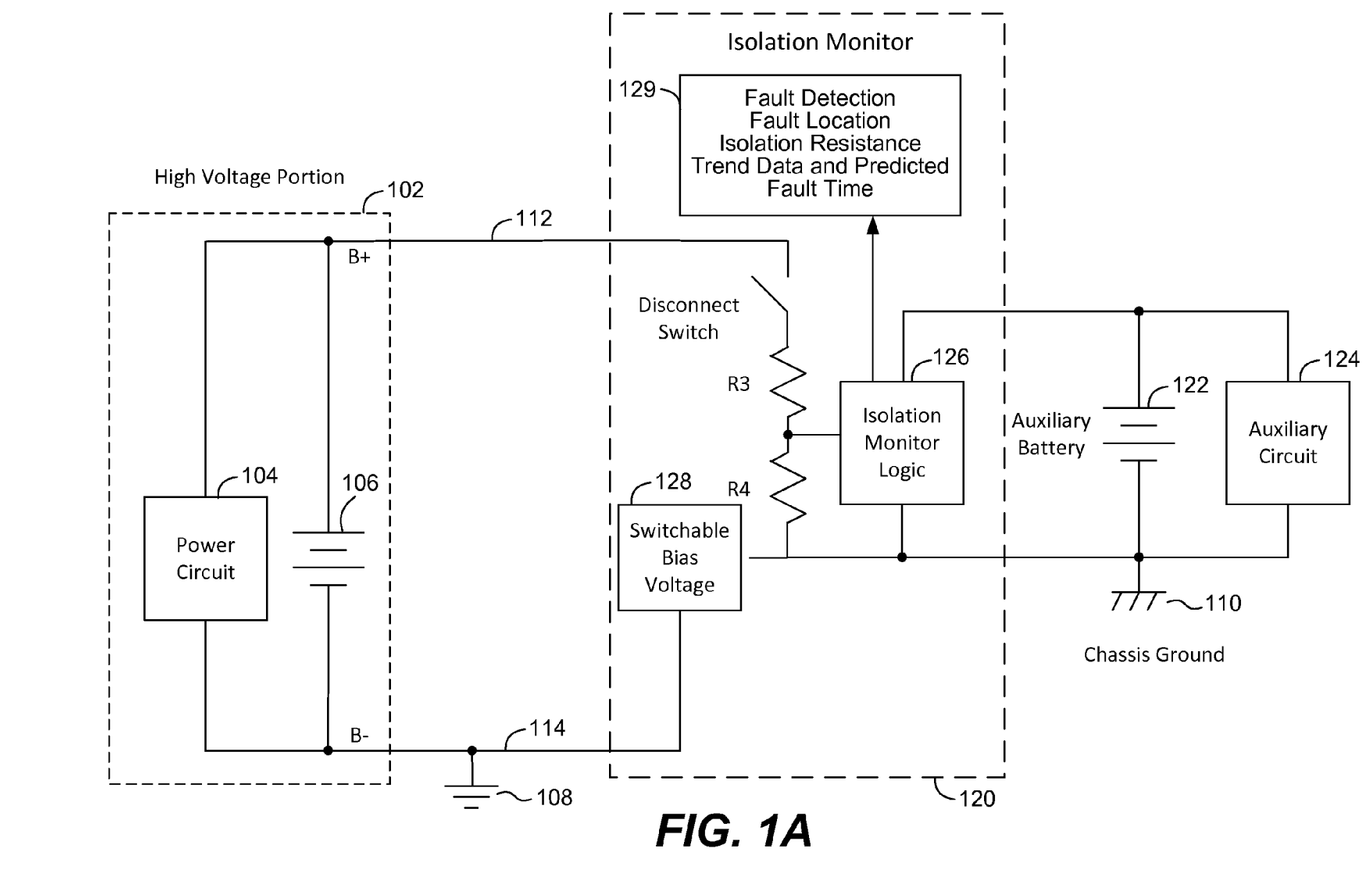
FIGS. 1A and 1B are high level system diagrams of an isolation monitor monitoring electrical isolation of a power circuit in accordance with one embodiment of the present invention.

FIG. 1A is a high-level block diagram illustrating aspects of the present invention in an embodiment of the present invention. An electrical device has a high voltage circuit portion 102 with positive and negative battery power terminals B+ and B−, respectively. The high voltage circuit 102 drives a power circuit 104. In the case of an electric vehicle, the power circuit 104 may include a motor controller (not shown) to drive one or more electric motors. The total voltage of a battery 106 is "high" in the sense that it may pose an electrical shock risk to a human user in the event of an electrical fault. As an illustrative example, the battery 106 may be based on a battery pack having a set of batteries arranged in series such that the total battery voltage may be greater than 100 V.

The high voltage circuit portion 102 has its own ground potential 108. The high voltage circuit portion 102 is also designed to have a high degree of electrical isolation from a chassis ground 110, which in an electric vehicle may corresponding to portions of the frame chassis (not shown) of the electric vehicle. Thus, the ideal is to have a high degree of electrical isolation between the high voltage circuit portion 102 and chassis ground 110. For example, the electrical isolation may be designed to be above some minimum acceptable isolation resistance as a safety measure to prevent electrical shocks to users or technicians. For example, in some applications an isolation resistance of at least 1 kΩ per volt is desired to keep any shocks to less than 1 mA of current. Thus for a system having a high voltage portion 102 with a maximum voltage of 100V an isolation resistance of a 100 kΩ or more may be desirable.

An isolation monitor 120 serves as a controller and is electrically coupled to voltage sense lines 112 and 114 of the high voltage circuit portion 102, such as a high voltage line (e.g., B+) and a ground line (e.g., B−). The isolation monitor 120 preferably resides in a low-voltage portion that may, for example, be powered by an auxiliary battery 122 and have low-voltage auxiliary circuits 124 and isolation monitor logic 126.

The isolation monitor 120 is illustrated as being integrated with the high voltage power circuit 102. However, more generally it will be understood that the isolation monitor 120 could be sold as a separate unit and connected by a manufacturer or end-user to voltage sense lines 112 and 114 of a high voltage circuit 102.

The isolation monitor 120 is grounded to the chassis ground 110 and measures an isolation voltage of the high voltage portion, such as through series resistors R3 and R4, where the values of resistors R3 and R4 may be chosen as a voltage divider to scale a maximum sensing voltage and to also have a high enough impedance such that the system's normal isolation resistance is acceptably high. An optional disconnect switch (S3) may be provided to disconnect the isolation monitor from the high voltage portion 102. A disconnect switch permits the isolation monitor to be turned off after a fault is detected to maximize isolation resistance or for other reasons, such as prevent potential interference with other devices or measurements.

The isolation monitor logic 126 may be implemented as a microprocessor controller having an analog-to-digital interface to measure an isolation voltage. In a microprocessor controller implementation, the isolation monitor logic 126 has computer code stored on a computer readable medium to enable it to execute software for one or more of the following features: insulation resistance, fault detection, electrical fault location, and determining trends in changes in isolation resistance to predict likely times when a fault will occur. Additionally, it will be understood that the isolation monitor logic 126 may also report to another entity such as a microprocessor 129 executing troubleshooting software. Additionally, it will be understood that all or part of the function of the isolation monitor logic 126 may be implemented as a controller implemented in hardware, such as custom logic circuits. In any case, the isolation monitor logic 126 performs the operations of a controller monitoring the isolation voltage at selected monitoring times and making determinations about how the measured isolation voltages correspond to an isolation resistance.

In one embodiment the isolation monitor logic 126 controls a switch position of one or more semiconductor switches that determines a voltage coupled from one or more of the voltage sense lines 112 and 114 of the high voltage circuit portion to the chassis ground, such as B+ or B−. As a result, a switchable bias voltage is applied to the chassis ground during monitoring periods. The switch rate may be comparatively low, e.g., one Hz., such that there are insignificant AC current effects. Consequently, the isolation voltage will swing between known values when there is no fault. However, when there is a fault the voltage will no longer swing between the known values but will instead tend to be fixed at some different value, depending on the electrical location of the fault and the fault resistance.

In one implementation, the switchable bias voltage module 128 includes at least one switch and at least one high impedance limiting resister to impose a changing voltage to the chassis ground 110. For example, the one or more switches may impose a changing voltage that, in the absence of a fault, swings the chassis ground voltage up and down to voltages corresponding to the B+ or B− potentials (or voltage divided fractions thereof).

Figure 1B:
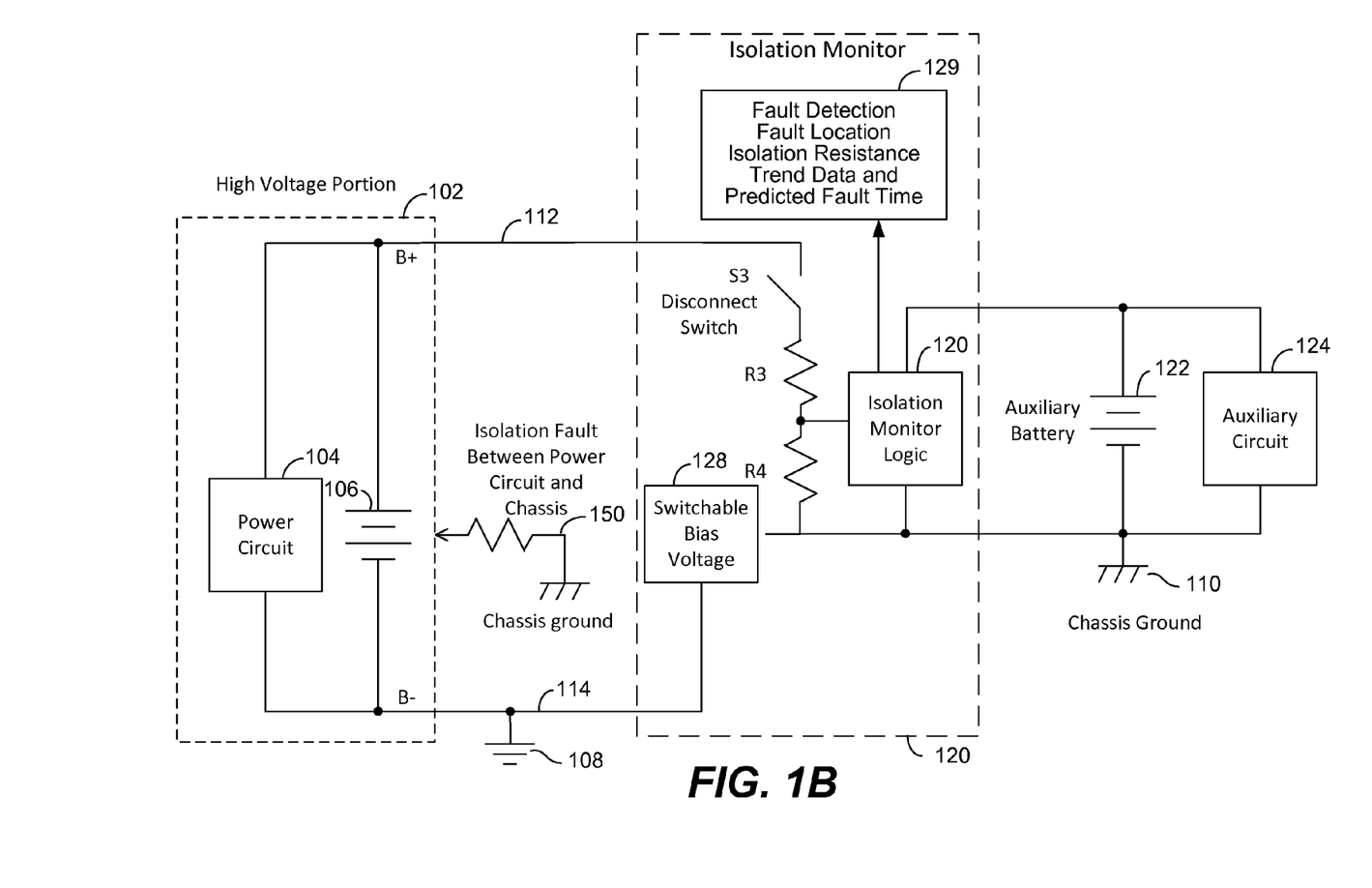

FIG. 1B illustrates the circuit of FIG. 1A with an additional isolation fault 150 illustrated between the power circuit and the chassis. For a battery pack an electrical fault may occur at the B+ or B− terminal and also at a midpoint of the battery pack, corresponding to an internal node within the series connections of the batteries that make up the battery pack. For example, with lead acid batteries, corrosion can occur, resulting in leakage conductance paths. Additionally, in the case of the power circuit driving an electric motor, the insulation in the motor windings can degrade over time and in some cases even melt, generating a fault. Moreover, other electrical components within a power circuit may also fail over time, generating a fault with an associated resistance and also having a fault location.

In any case, if there is an isolation fault between the power circuit and the chassis then this fault also acts to modify the voltage at the chassis ground and thus the switchable bias voltage module cannot freely control the bias applied to the chassis ground 110. Generally, when a fault connection occurs, the chassis voltage is pulled to a fixed value relative to the power circuit. For example, if the fault is a pure short to the B+ or B− terminal then the chassis ground potential is determined by the fault. More generally a fault has an associated fault resistance and may also correspond to a midpoint fault with respect to the maximum potential voltage in the high voltage portion. Thus in the general case the fault competes with the switchable bias voltage module 128 in determining the voltage imposed on the chassis ground. A significant fault will result in the fault substantially or completely controlling the chassis ground voltage.

The electrical characteristics of the switchable bias voltage module 128 may be selected so that isolation monitor has a desired sensitivity to detecting the presence of isolation faults within specified ranges of fault resistances. An alarm signal or alarm code and be generated if the isolation resistance is below a threshold level. Note that a trigger threshold should consider the impedance that the monitor circuit introduces.

In the event of a fault, the chassis ground 110 has a fault with an associated resistance tending to pull the chassis ground voltage. As a result, the presence of a fault may be detected by monitoring changes in an isolation voltage when the bias voltage is applied. For example, if the fault is a short, the fault acts to pull the isolation voltage to a fixed value relative to the power circuit 104. Thus, the isolation monitor can identify a fault by monitoring the isolation voltage that results as the switches impose a changing voltage.

In one embodiment, a fault is detected by the isolation monitor 120 and an alarm signal or an alarm code is generated if an isolation resistance decreases below a threshold level. In one embodiment the isolation monitor determines (or provides to diagnostic logic 129 information to make a determination) of trends (changes over time) in isolation resistance and predicts a failure time for the high voltage electrical circuit, such as a predicted failure time for an electric motor. In some embodiments, the location of a fault may also be determined, as described below in more detail.

Figure 2:
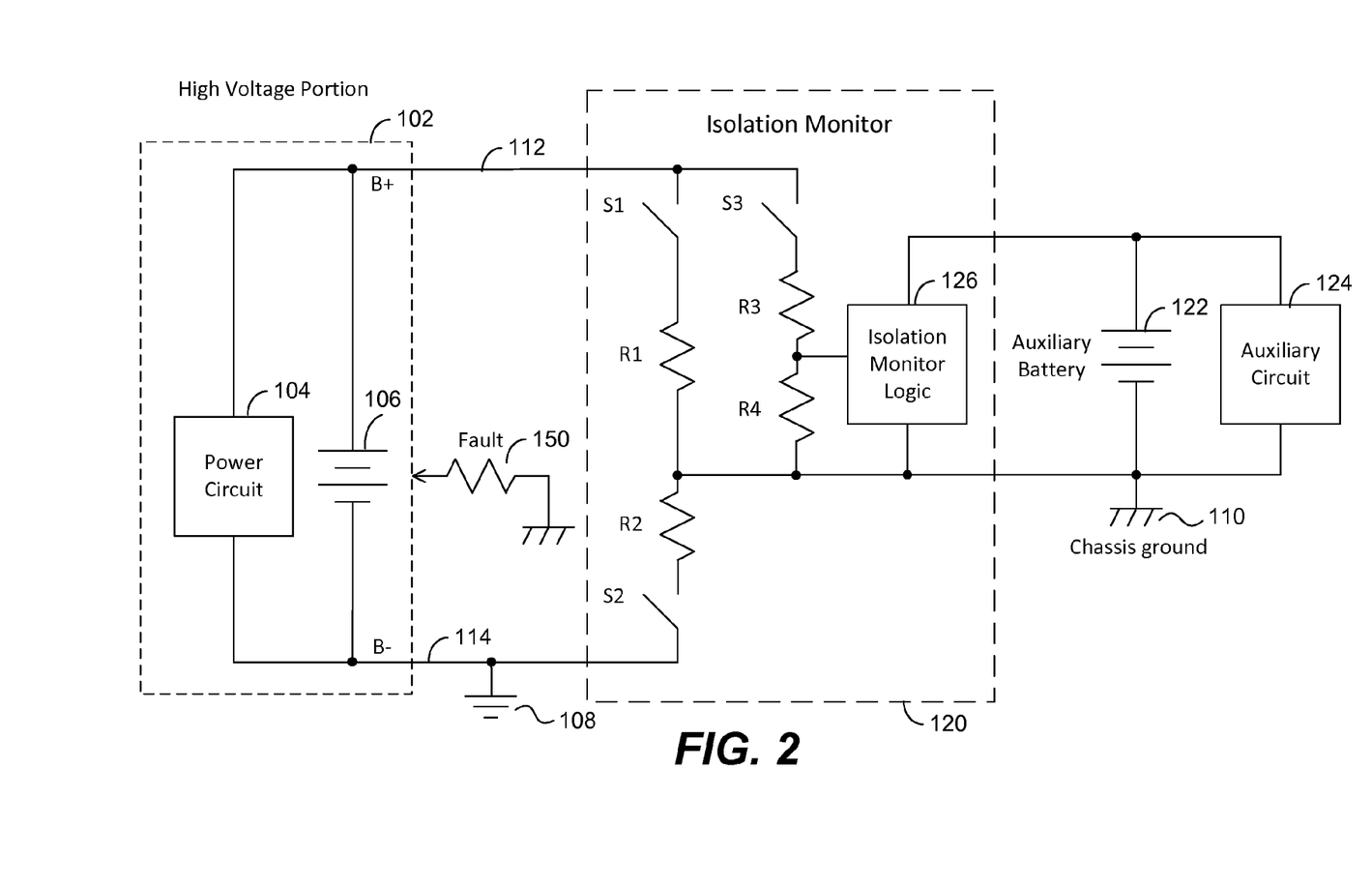
FIG. 2 is a circuit diagram of an isolation monitor coupled to a power circuit in accordance with one embodiment of the present invention.

FIG. 2 illustrates an exemplary isolation monitor 120 in accordance with one embodiment of the present invention with additional components illustrated to implement a switchable bias voltage, including switches S1, S2 and resistors R1 and R2. A power circuit 104 in a high voltage portion 102 may have an undesired fault 150 reducing the isolation between the power circuit 104 and the chassis ground 110. The fault 150 has an associated fault resistance. In addition, the fault has an electrical fault location relative to the B+ and B− voltage terminals. For example, the fault could be located at the B+ terminal corresponding to 100% of the B+ voltage. Alternatively, the fault could occur at the B− terminal, corresponding to 0%. More generally the fault may also occur at a midpoint, corresponding to a variable percentage of the total battery voltage.

An optional switch S3 is preferably provided to permit the isolation monitor to be electrically connected and disconnected to the high voltage circuit. During isolation monitoring switch S3 is closed. However, switch S3 may be placed in an open position when not in use to prevent potential interference with other devices, such as battery charger Ground Fault Circuit Interrupter (GFCI) devices. Additionally, switch S3 (and other switches) may be placed in an open position after detecting a fault as an additional safety measure.

Switches S1, S2, and S3 may be implemented using a variety of isolated switching devices, such as photo-relays, reed switches, or digital optical isolation. However, in one implementation the switches are implemented using photo-relays to improve electrical isolation of the switches. Resistors R3 and R4 may be chosen to scale a maximum sensing voltage and to also have a high enough impedance such that the system's normal isolation resistance is acceptably high.

During monitoring operations, one of the switches S1 and S2 is closed at a given time during a portion of a monitoring cycle. Referring to the equivalent circuit of FIG. 3, during a first portion of a monitoring cycle the switch S1 may be open while switch S2 is closed when the isolation voltage is measured, which is illustrated as an isolation voltage of Vi1. Referring to the equivalent circuit of FIG. 4, in a different portion of the monitoring cycle, the switch S1 is closed and the switch S2 is open and the isolation is measured resulting in isolation voltage of Vi2. Exemplary monitoring times to measure an individual isolation voltage may, for example, be on the order of about one Hz.

Figure 3:
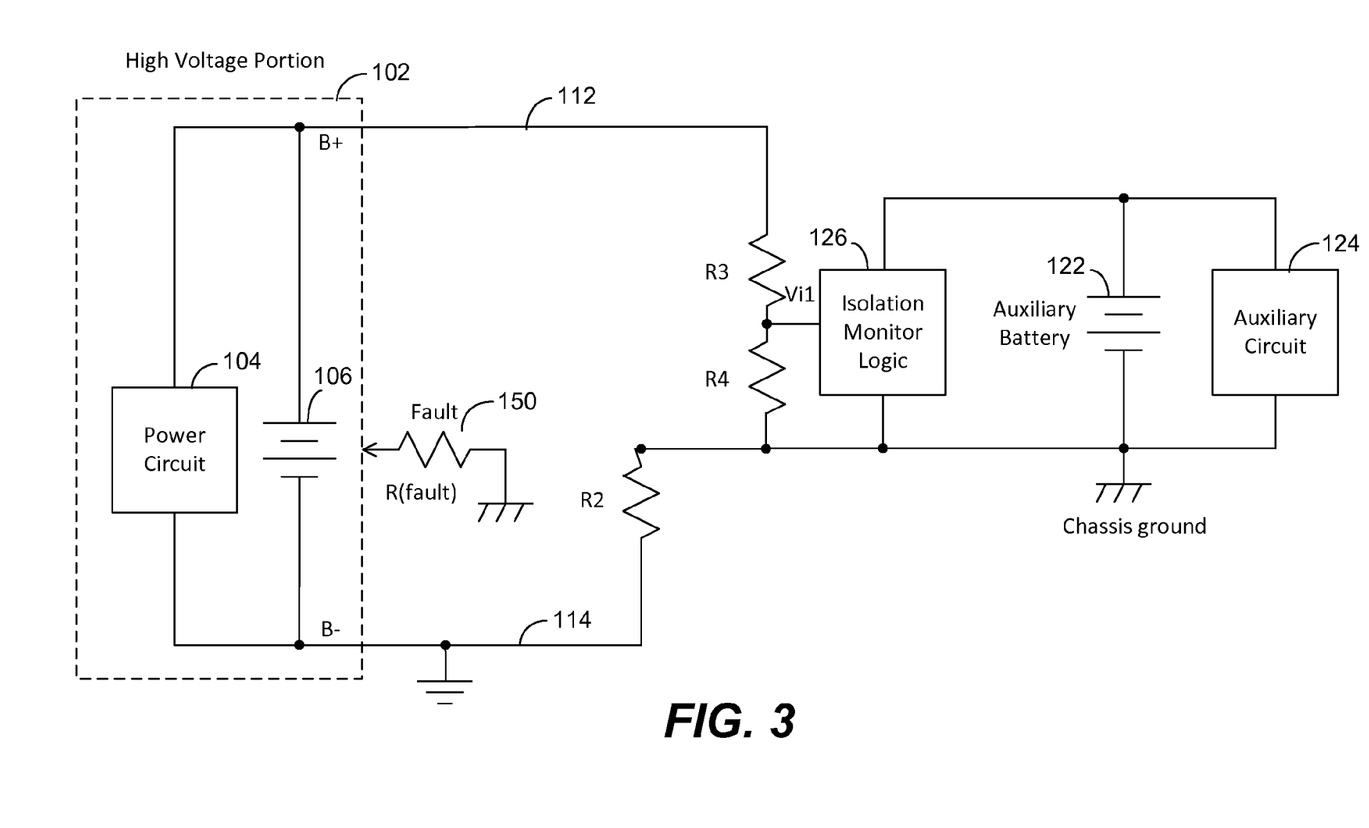
FIG. 3 is an equivalent circuit diagram for the circuit of FIG. 2 monitoring a first isolation voltage in a first switch operation configuration.
Figure 4:
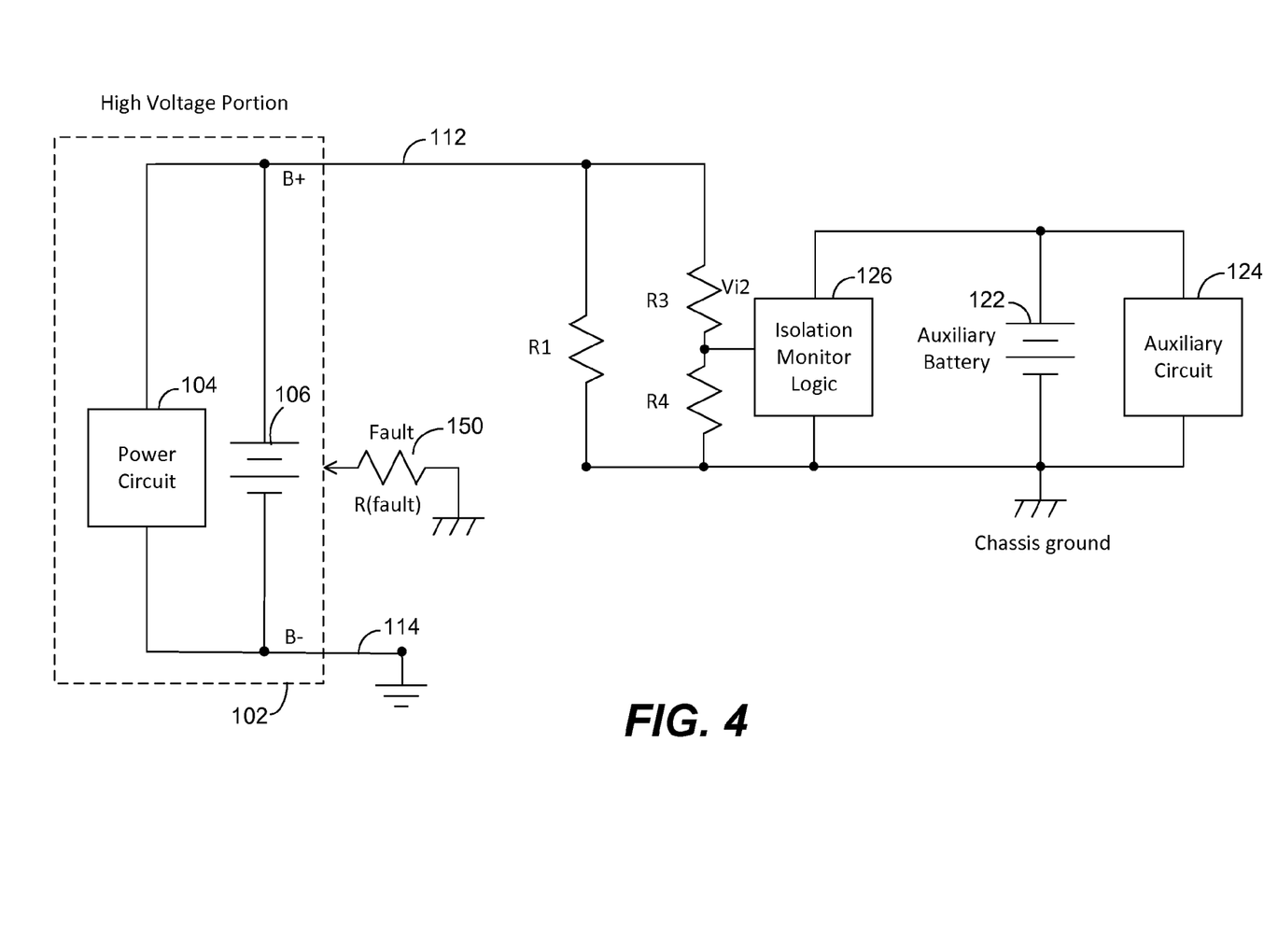
FIG. 4 is an equivalent circuit diagram for the circuit of FIG. 2 monitoring a second isolation voltage in a second switch operation configuration.

As a consequence, if there is no fault then a variable bias voltage is applied to the chassis ground. If there is no fault then if S1 is open and S2 is closed then the chassis ground is pulled to the B− potential (FIG. 3). If there is no fault, then if S1 is closed and S2 is open then the chassis ground is pulled to the B+ potential (FIG. 4). However in the presence of a fault 150 the fault modifies the applied bias depending on the resistance of the fault and whether it is a midpoint fault.

Figure 5A:
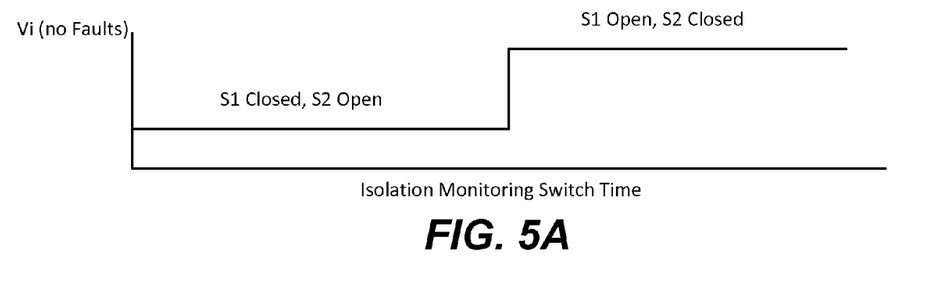
FIG. 5A illustrates an idealized isolation monitoring voltage for the first and second switch operation configuration without any faults.
Figure 5B:
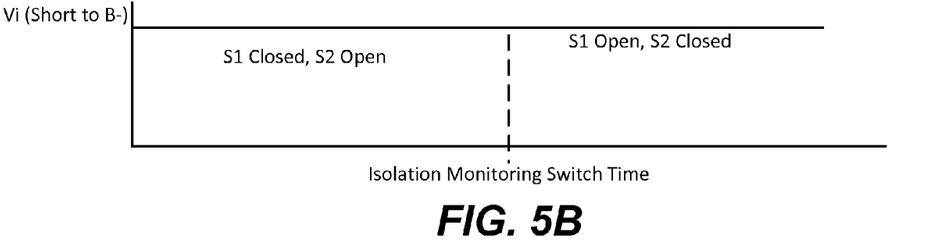
FIG. 5B illustrates an idealized isolation monitoring voltage with a fault corresponding to a short at a first battery terminal.
Figure 5C:
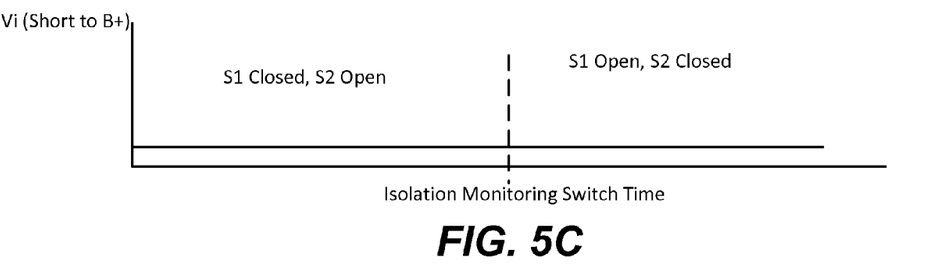
FIG. 5C illustrates an idealized isolation monitoring voltage with a fault corresponding to a short at a second battery terminal.

FIGS. 5A, 5B, and 5C illustrate idealized isolation voltage measurements for different switch positions for the circuit of FIG. 2. FIG. 5A illustrates exemplary measurements for the case of no fault. FIG. 5B illustrates an idealized measurement for the case of a pure short to the B− terminal. FIG. 5C illustrates the case of a pure short to the B+ terminal. As illustrated by these figures, there is a normal voltage swing when there is no fault. A constant isolation voltage measurement is consistent with a fault that is a short.

In the interests of safety of users and technicians it is desirable that a failure of the isolation monitor not generate a safety hazard by preventing the detection of a fault. One aspect of the circuit of FIG. 2 is that any switch failure (opened or closed) results in an artificially low calculated isolation resistance because it reduces the amount of voltage swing during monitor operation irrespective of the external isolation resistance. This means that the a fault is triggered early but never late, i.e., errs on the side of generating a fault signal if the switches of the isolation monitor circuit has problems. Consequently, if a switch fails then a fault signal is generated, which would alert a technician to perform a diagnostic test. Similarly, other types of failures in the isolation monitor, such as a stuck voltage sense line, open circuits to the power connection, or even an open circuit of all switches result in no voltage swing. In these examples, failures within the isolation monitoring circuits result in no voltage swing, which causes detection logic to indicate a frame fault to prompt further troubleshooting by a technician.

Full circuit modeling of the isolation monitor of FIG. 2 can be performed from first principles by analyzing the currents entering and leaving each node and the voltages in each circuit loop. In such an analysis the electrical location of a fault and an associated fault resistance can be modeled for different selection of resistors R1, R2, R3, and R4. This results in a series of equations in which the resistances (R1, R2, R3, and R4) have selectable known values that may be chosen by a circuit designer and in which there are two measured variables (Vi1 and Vi2 for the two different switch configurations during isolation voltage monitoring), along with two unknowns (the resistance of a fault and its electrical location in terms of a percentage value with respect to the maximum potential of the high voltage portion). As are thus two variables and two unknowns such that it is mathematically possible, based on first principles of circuit modeling, to calculate whether there is a fault and also an approximate location of the fault relative to B+ and B− potentials in a battery pack.

The selection of the values of resistors R1, R2, R3, and R4 may be selected to optimize the sensitivity of the isolation monitor to detect changes in isolation resistance and also determine the approximate physical location of a fault. For the purposes of aiding a technician to find a fault, note that even the approximate location of a fault is useful, such as determining whether a fault lies with 0%, 25%, 50%, 75%, or 100% of the battery potential. Consequently, in one embodiment the isolation monitor logic determines both the resistance value of a fault and its approximate location. Additionally, in one implementation, trend data is collected over time to detect gradual degradation in isolation resistance. This information may, for example, be used to predict a likely time to failure in the face of gradual changes in isolation resistance.

Figure 6:
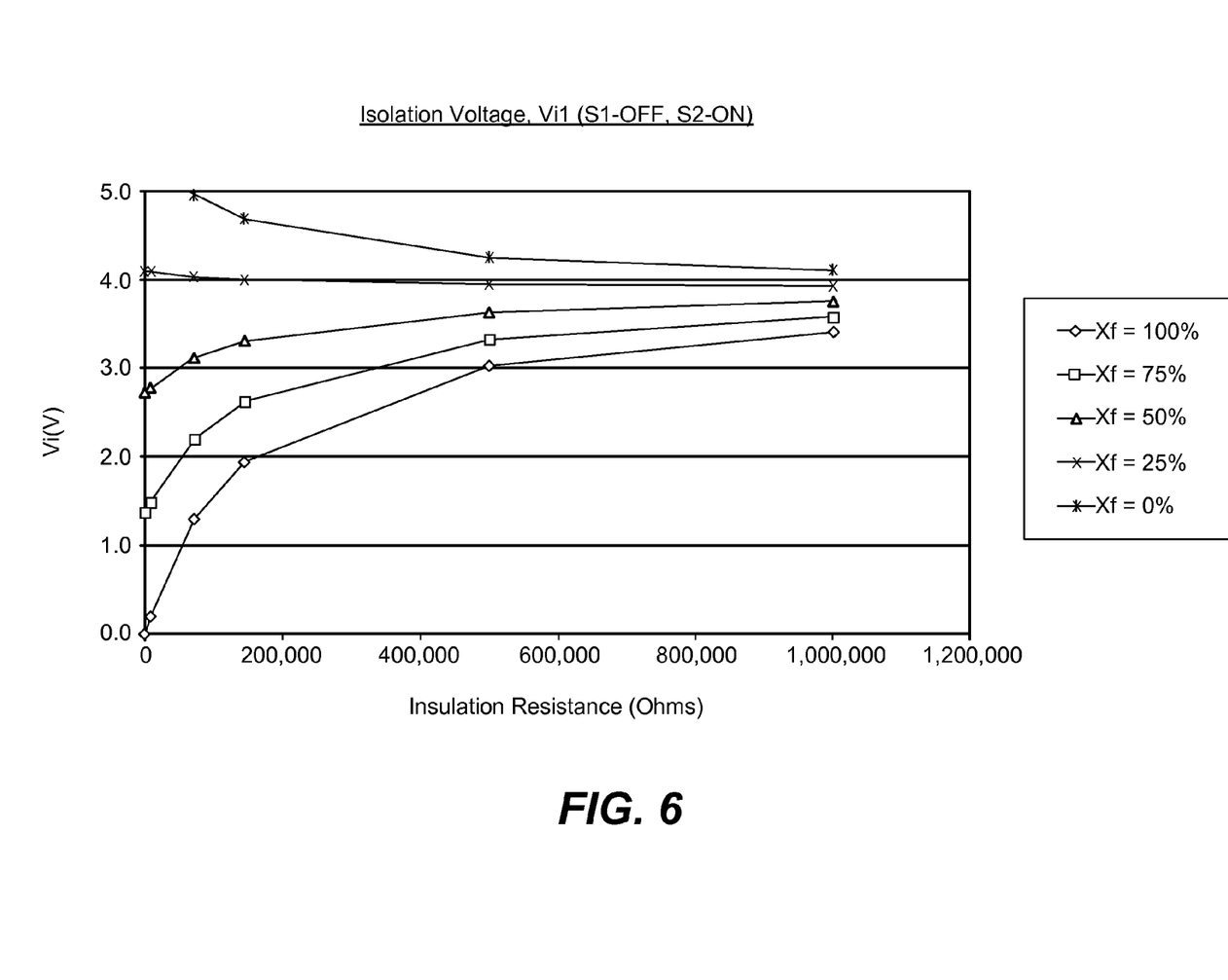
FIG. 6 illustrates a plot of a first isolation voltage versus isolation resistance for different electrical fault locations.
Figure 7:
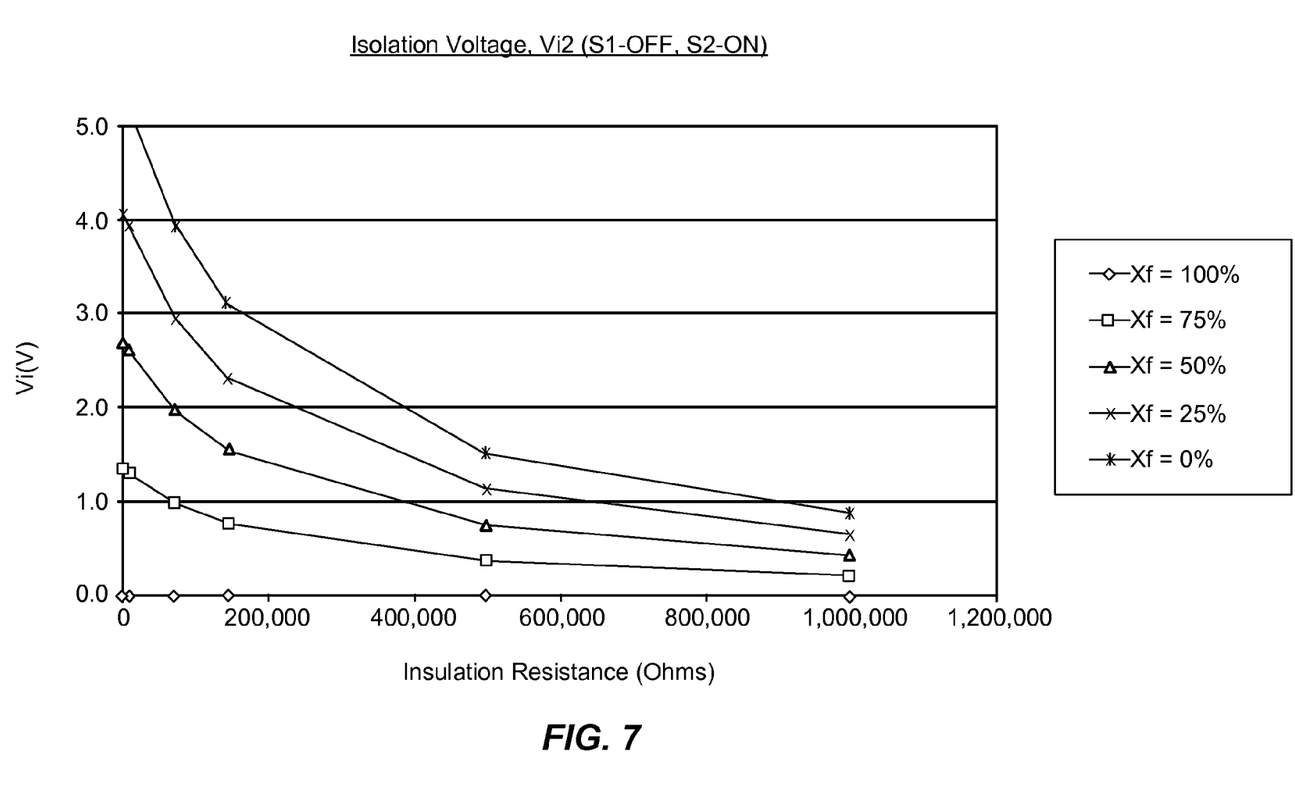
FIG. 7 illustrates a plot of a second isolation voltage versus isolation resistance for different electrical fault locations.
Figure 8:
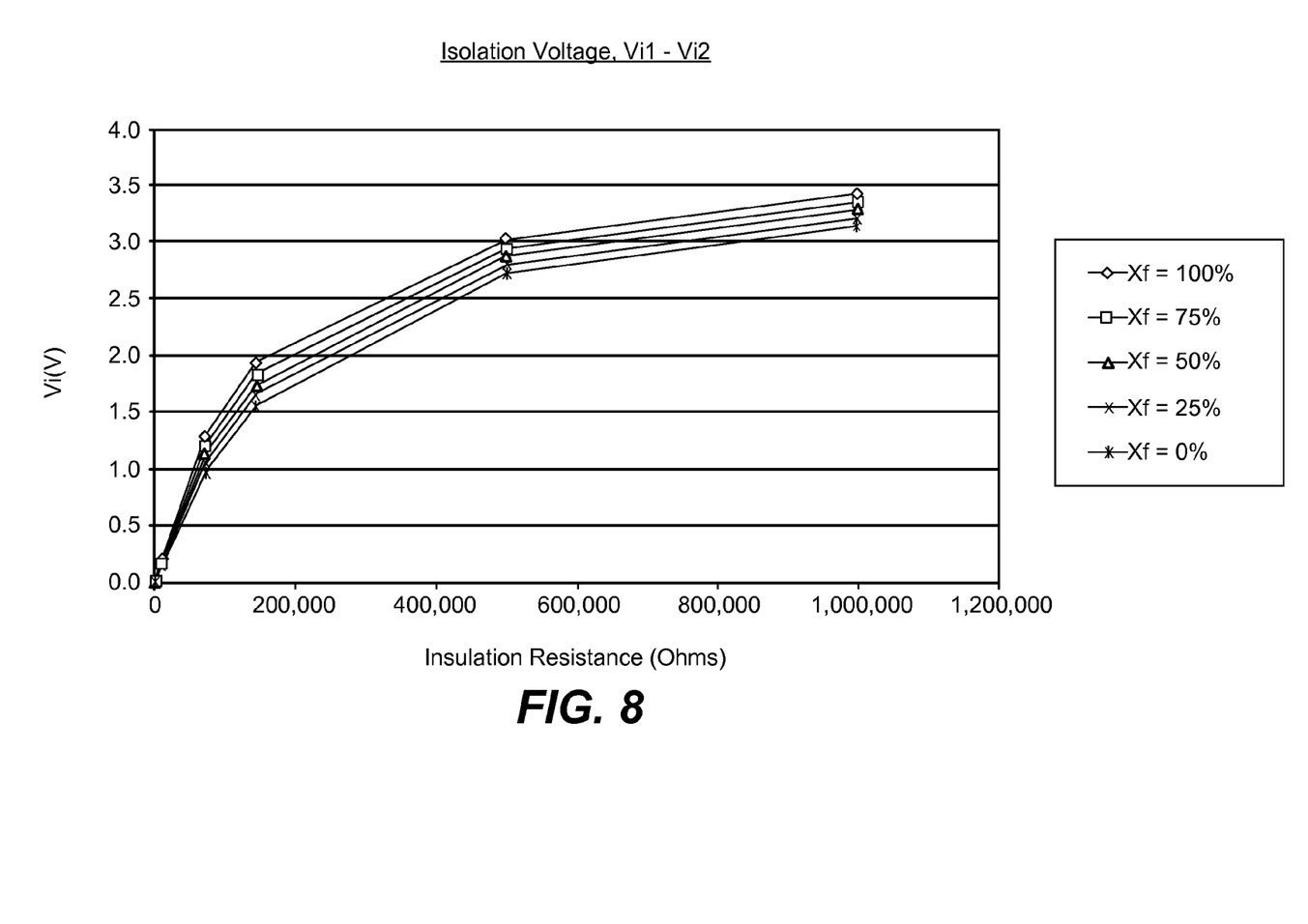
FIG. 8 illustrates a plot of a difference value of the first and second isolation voltages versus isolation resistance for different electrical fault locations.

FIGS. 6, 7, and 8 illustrate exemplary calculations of isolation resistance for different electrical fault locations in terms of a percentage value with respect to the battery potential. Resistor R1 is modeled as having a resistance of 309,000 ohms. Resistor R2 is modeled as having a resistance of 205,000 ohms. Resister R3 is modeled as having a resistance of 499,000 Ohms. Resistor R4 is modeled as having a resistance of 14,000 Ohms FIG. 6 illustrates calculations for voltage V1 corresponding to S1 off and S2 on. FIG. 7 illustrates calculations for voltage V2 corresponding to switch S1 on and switch S2 off. FIG. 8 illustrates the calculations using the difference Vi1–Vi2. The main point is that the effects of fault location on isolation resistance using different isolation voltage measurements can be calculated and from this information approximate estimates of the fault location can be determined. The calculations may, for example, be converted into lookup tables or converted into mathematical algorithms. In particular, for a particular application a table comparing insulation resistance (Rf) for selected resistance values may be created for each electrical fault location (e.g., 0%, 25%, 50%, 75%, and 100%) along with values of Vi1, Vi2, and Vi1–Vi2. From these measured values, a best-fit match is then made to the choice of insulation resistance and fault location.

One application of the isolation monitor is to integrate it into a power circuit that is a motor controller. Moreover, if the isolation monitor is not required for a particular application the switches (e.g., switches S1, S2, and S3) may disconnect the isolation monitor from the chassis.

While examples of the isolation monitoring technique have been described with regards to a power circuit having a DC battery voltage supply, more generally it will be understood that a similar approach may be applied to selected AC applications and/or power sources that are not batteries.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention.

As previously discussed, the isolation monitor may be implemented with isolation monitor logic implemented in software or in hardware. Accordingly, individual methods may be implemented as computer program code stored on a computer readable medium that execute on one or more processors. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

What is claimed is:

1. An isolation monitor for an electric vehicle having a battery pack, comprising:
    a controller monitoring an isolation voltage between a power circuit in a high voltage circuit portion powered by the battery pack and a chassis of the electric vehicle;
    a switchable bias voltage module applying a switchable DC bias voltage between at least one DC battery voltage sense line of the power circuit and a chassis during one or more isolation monitoring periods wherein the switchable bias voltage module comprises a switchable voltage divider that includes a first switchable path having a first switch with a first series resistor to couple the chassis ground to a first DC sense voltage line of the power circuit in a first portion of a monitoring cycle and a second switchable path having a second switch with a second series resistor to couple the chassis ground to a second DC sense voltage line of the power circuit in a second portion of a monitoring cycle; and
    the isolation monitor configured to monitor an isolation voltage having a first known value in a first portion of a monitoring cycle when there is no electrical fault and a second known value in a second portion of the monitoring cycle when there is no electrical fault and determine whether there is a fault and a fault location based on monitoring changes in the isolation voltage in the first portion of the monitoring cycle and the second portion of the monitoring cycle.

2. The isolation monitor of claim 1, wherein the controller triggers an alarm when the isolation resistance is below a threshold level.

3. The isolation monitor of claim 1, wherein the controller monitors changes in isolation resistance to predict a failure time.

4. An isolation monitor to monitor isolation resistance between a power circuit and a chassis in a battery powered electric vehicle, comprising:
    a controller monitoring an isolation voltage through a voltage divider circuit coupled between a first DC battery voltage sense line of the power circuit and a chassis ground;
    the voltage divider circuit including a first switch in series with a first resistor having a first known resistance value configured such that when the first switch is turned on it in a first portion of a monitoring cycle it couples a first DC bias voltage to the chassis ground;
    the voltage divider circuit including a second switch in series with a second resistor having a second known resistance value configured such that when the second switch is turned on in a second portion of a monitoring cycle it couples a second DC bias voltage to the chassis ground;
    the first switch and the second switch being operated in a monitoring mode to toggle the bias voltage between the first DC bias voltage and the second DC bias voltage;
    wherein if an electrical fault exists between the high voltage portion and the chassis ground the electrical fault acts as a voltage source having an associated resistance coupled to the chassis ground;
    the isolation monitor configured to monitor an isolation voltage during the first and second portions of each monitoring period to monitor the isolation between the power circuit and the chassis; and
    wherein when there is no electrical fault, the isolation voltage has a first known value in the first portion of the monitoring cycle when and a second known value in the second portion of the monitoring cycle and the isolation monitor determines when an electrical fault exists between the high voltage portion and the chassis ground the electrical fault acts as a voltage source having an associated resistance coupled to the chassis ground that modifies the measured isolation voltages; and
    wherein the at least two different bias voltages correspond to a positive battery voltage and a negative battery voltage, wherein the isolation monitor monitors a first isolation voltage in the first portion of the monitoring cycle when the chassis is coupled to a positive battery voltage and a second isolation voltage in the second portion of the monitoring cycle when the chassis is coupled to a negative battery voltage and the isolation monitor determines whether there is a fault and a fault location based on monitoring the isolation voltage for the two different DC bias voltages.

5. The isolation monitor of claim 4, wherein the controller triggers an alarm when the isolation resistance is below a threshold level.

6. The isolation monitor of claim 4, wherein the controller monitors changes in isolation resistance to predict a failure time.

7. The isolation monitor of claim 4, wherein the isolation monitor is integrated in a motor controller.

8. A method of performing isolation monitoring, comprising:
applying a first switchable bias voltage to a chassis ground via a switchable voltage divider circuit;
measuring an isolation voltage between a power circuit and a chassis during time periods when the first switchable bias voltage is applied;
applying a second switchable bias voltage to a chassis ground via the switchable voltage divider circuit;
measuring an isolation voltage between a power circuit and a chassis during time periods when the second switchable bias voltage is applied; and
analyzing changes in isolation voltages from the measurements during the first time periods and the second time periods to detect an electrical fault between the power circuit and the chassis ground, wherein the fault is located at an electrical midpoint with respect to the power circuit and the chassis ground;
wherein in a first measuring time period the bias voltage is applied from an upper set of high impedance resistors via an upper sense line and in a second measuring time period the bias voltage is applied from a lower set of high impedance resistors via a lower sense line and determining a fault location is based on monitoring isolation voltages for the two different bias voltages.

9. The method of claim 8 further comprising triggering an alarm when the isolation resistance is below a threshold level.

10. The method of claim 8, further comprising monitoring changes in isolation resistance to predict a failure time.

11. An isolation monitoring system, comprising:
sense lines coupled to a positive battery line and a negative battery line of a high voltage circuit;
a controller to monitor isolation voltage between the high voltage circuit and a chassis via a switchable voltage divider circuit, the controller configured to:
apply a switchable DC bias voltage to a chassis ground via the switchable voltage divider circuit, wherein the switchable voltage divider circuit includes at least one switch to couple the chassis ground to at least one potential of the high voltage circuit;
measure an isolation voltage between a power circuit and a chassis during time periods when the switchable bias voltage is applied; and
detect changes in isolation voltages associated with electrical faults between the power circuit and the chassis ground;
wherein in a first measuring time period the bias voltage is applied from an upper set of high impedance resistors via an upper sense line and in a second measuring time period the bias voltage is applied from a lower set of high impedance resistors via a lower sense line and wherein the controller determines existence of an electrical fault and a fault location based on monitoring the isolation voltage for two different bias voltages.

12. The isolation monitor of claim 11, wherein the controller triggers an alarm when the isolation resistance is below a threshold level.

13. The isolation monitor of claim 11, wherein the controller monitors changes in isolation resistance to predict a failure time.

14. The isolation monitor of claim 1, wherein the isolation monitor is configured to detect midpoint faults in the battery pack.

15. The isolation monitor of claim 1, wherein the isolation monitor is configured to detect a fault location corresponding to a midpoint fault in the battery pack.

16. The isolation monitoring system of claim 11, wherein the isolation monitor is configured to detect midpoint faults in a battery pack.

17. The isolation monitoring system of claim 11, wherein the isolation monitor is configured to detect a fault location corresponding to a midpoint fault in the battery pack.

18. The method of claim 8, wherein the electric faults is a midpoint fault of a battery pack.

* * * * *